United States Patent [19]

Green et al.

[11] Patent Number: 5,691,654
[45] Date of Patent: Nov. 25, 1997

[54] VOLTAGE LEVEL TRANSLATOR CIRCUIT

[75] Inventors: Gary W. Green, Pleasanton; Mathew R. Arcoleo, San Jose; Piyush Sevalia, Sunnyvale, all of Calif.

[73] Assignee: Cypress Semiconductor Corp., San Jose, Calif.

[21] Appl. No.: 572,618

[22] Filed: Dec. 14, 1995

[51] Int. Cl.$^6$ .................................................. H03K 17/16
[52] U.S. Cl. .................................. 326/80; 326/34; 326/81
[58] Field of Search ........................... 326/21–31, 32–34, 326/80–81

[56] References Cited

U.S. PATENT DOCUMENTS

| | | | |
|---|---|---|---|
| 4,412,347 | 10/1983 | Lipcon | 323/281 X |
| 4,555,642 | 11/1985 | Morales | 326/71 |
| 4,763,021 | 8/1988 | Stickel | 326/33 X |
| 4,820,937 | 4/1989 | Hsieh | 326/34 X |
| 4,992,677 | 2/1991 | Ishibashi et al. | 307/443 |
| 5,166,558 | 11/1992 | Ohsawa | 326/73 X |
| 5,184,035 | 2/1993 | Sugibayashi | 307/482 |
| 5,206,550 | 4/1993 | Mehta | 307/530 |
| 5,257,146 | 10/1993 | Price, Jr. et al. | 360/67 |
| 5,280,200 | 1/1994 | Tarng | 307/446 |
| 5,283,484 | 2/1994 | Brehmer et al. | 307/555 |
| 5,296,760 | 3/1994 | Oertle et al. | 307/475 |
| 5,371,552 | 12/1994 | Brummette et al. | 348/697 |
| 5,382,917 | 1/1995 | Miyake et al. | 330/255 |
| 5,384,503 | 1/1995 | Shu et al. | 327/52 |
| 5,390,101 | 2/1995 | Brown | 363/20 |
| 5,394,037 | 2/1995 | Josephson et al. | 327/51 |
| 5,404,333 | 4/1995 | Mehta | 365/208 |
| 5,418,482 | 5/1995 | Wong et al. | 327/51 |
| 5,426,385 | 6/1995 | Lai | 327/57 |
| 5,434,717 | 7/1995 | Yoshinaga et al. | 360/46 |
| 5,438,287 | 8/1995 | Faue | 327/54 |
| 5,453,704 | 9/1995 | Kawashima | 326/81 |
| 5,528,172 | 6/1996 | Sundstrom | 326/80 |
| 5,541,534 | 7/1996 | Cao et al. | 326/5 |

OTHER PUBLICATIONS

Horenstein, "Digital Circuits, CMOS Logic Family" *Microelectronic Circuit & Devices*, Chapter 16, pp. 752–755 (1990).

*Primary Examiner*—David R. Hudspeth
*Attorney, Agent, or Firm*—Blakely Sokoloff Taylor & Zafman LLP

[57] ABSTRACT

A method of limiting or translating the voltages of input signals, and of generating output signals such that the input's high state and low state differ by a different voltage than the output's high and low state. The present invention also teaches a system comprising a level translator circuit having level translators controlled by an operational amplifier or by a Zener diode that regulates the voltage level on one side of the translators, the other side of the translators being regulated by an external power supply. The operational amplifier or Zener diode, in some embodiments of the present invention, ensures that the second side of the level translators are limited to a given reference voltage. Often, a resistor is connected to the Zener diode or to the output of the operational amplifier, and in some embodiments a resistor-capacitor network removes higher-frequency components from the voltage supply. The invention includes a system level embodiment, in which the voltage level translators protect a memory and bus from voltage levels that would otherwise cause damage.

16 Claims, 6 Drawing Sheets

VOLTAGE LEVEL TRANSLATOR CIRCUIT

FIELD OF THE INVENTION

The present invention relates to the field of voltage level translators; more particularly, the present invention relates to integrated circuit voltage level translators.

BACKGROUND OF THE INVENTION

Often in a digital circuit system, various subsystems operate with different power and voltage requirements. This is especially true when components are purchased from different suppliers whose products comply with different standards. Some integrated circuit protocols and systems require a supply voltage with a $V_{cc}$ (the positive rail voltage) of 3.3 volts and a $V_{ss}$ (the lower rail voltage) of ground potential, while others require a $V_{cc}$-to-$V_{ss}$ voltage drop of 5.0 volts or 2.9 volts. To connect these different subsystems in a way that allows an exchange of information between them, converters must be used.

Incorrectly converting the rail voltage and output voltage levels of digital circuits can be devastating to a digital system. Many microprocessors and other circuits are extremely sensitive to over-voltages or over-currents, since these can not only allow incorrect results but can also cause physical damage to the integrated circuit. Most processors have voltage and current ratings that may not be exceeded without causing severe damage to the processor. It is not uncommon for processors operating at a Vcc of 3.3 volts to be damaged by application of signals in excess of 3.45 volts by reading data from RAMs in which the high/low voltage difference is 5 volts. Therefore, limiting the voltage levels is essential to safe operation. Limiting the voltages applied to different subsystems can be problematic, however, especially when several temperature-responsive elements are placed between the power supply and the level converters. The outputs of many elements, including diodes and resistors, may have a significant temperature dependency. If several elements that each allow a 5% tolerance or temperature-induced deviation in voltage at the output are placed in series, the tolerances compound into a very large voltage deviation, possibly exceeding the input voltage rating of a processor.

Thus, it is desirable to protect processors receiving inputs from a digital circuit or memory, by ensuring that the voltage output from the circuit does not exceed the rating of the processor. Such protection can be provided by level translators. However, it is also desirable to make certain that protection of a processor will not deteriorate simply because the properties of a resistor or diode change due to temperature variations. It is also desirable to ensure that, even if the rated values differ from their actual values, due for example to manufacturing tolerances, processors will still be protected from high voltage inputs.

SUMMARY OF THE INVENTION

The present invention teaches a method of limiting or translating the voltages of input signals, and of generating output signals such that the input's high state and low state differ by a different voltage than the output's high and low state.

The present invention also teaches a system comprising a level translator circuit having level translators controlled by an operational amplifier that regulates the voltage level on one side of the translators, the other side of the translators being regulated by an external power supply. The operational amplifier, in some embodiments of the present invention, ensures that the second side of the level translators are maintained at a given reference voltage.

In another embodiment, the present invention regulates the voltages of the second side of the level translators by using a Zener diode to maintain the second side voltage at a substantially constant level. Often, a resistor is connected to the Zener diode to ensure sufficient and limit excessive current through the diode to maintain the diode in a conducting state.

In a third embodiment, the present invention also teaches a method of translating voltages from a first voltage level to a second voltage level by generating a reference signal and applying voltages differing by the reference signal voltage to the power supply terminals of a digital device that receives the input signals. The power supply terminals can be the rail voltage terminals (Vcc and Vss of the digital device).

The invention includes a system level embodiment, in which the voltage level translators protect a memory and bus from voltage levels that would otherwise cause damage.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A constant-level integrated circuit voltage level translator is described. In the following description, numerous details are set forth, such as voltages, voltage ranges, voltage tolerances, etc. It will be apparent, however, to one skilled in the art, that the present invention may be practiced without these specific details. In other instances, well-known structures and devices are shown in block diagram form, rather than in detail, in order to avoid obscuring the present invention.

Figure 1:
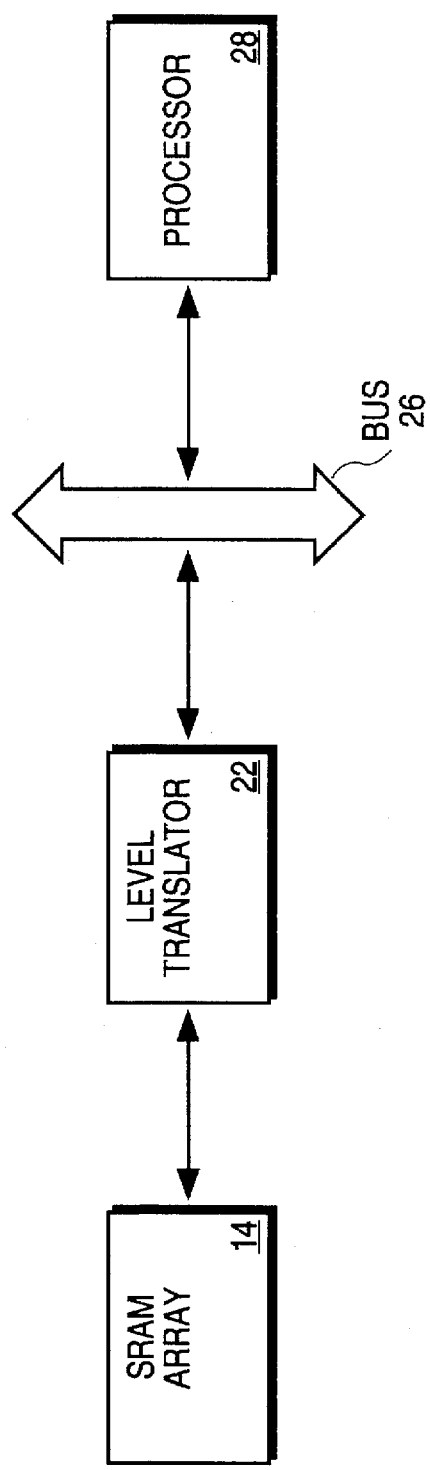
FIG. 1 illustrates a system which includes level translators.

Referring now to FIG. 1, a system diagram which includes level translator 22 is shown. An SRAM array 14, or other circuit using 5.0 volts (v) to represent one logical level and 0.0 volts to represent another logical level is connected by a bus 26 to a processor 28. In the embodiment of the system shown in FIG. 1, the processor 28 is a Pentium 90 P54C, a processor 28 that is damaged if a voltage level in excess of 3.45 volts is applied to its data/address inputs. Between the SRAM 14 and the bus 26 is a plurality of level translators 22, receiving data from the SRAM 14 and providing data to the bus 26 or receiving data from the bus and providing it to the SRAM. It will be appreciated that the level translator 22 may be disposed between other types of components rather than SRAM and a processor. For example, the components may be DRAM and a co-processor or other components having mismatched voltage ranges.

Figure 2A:
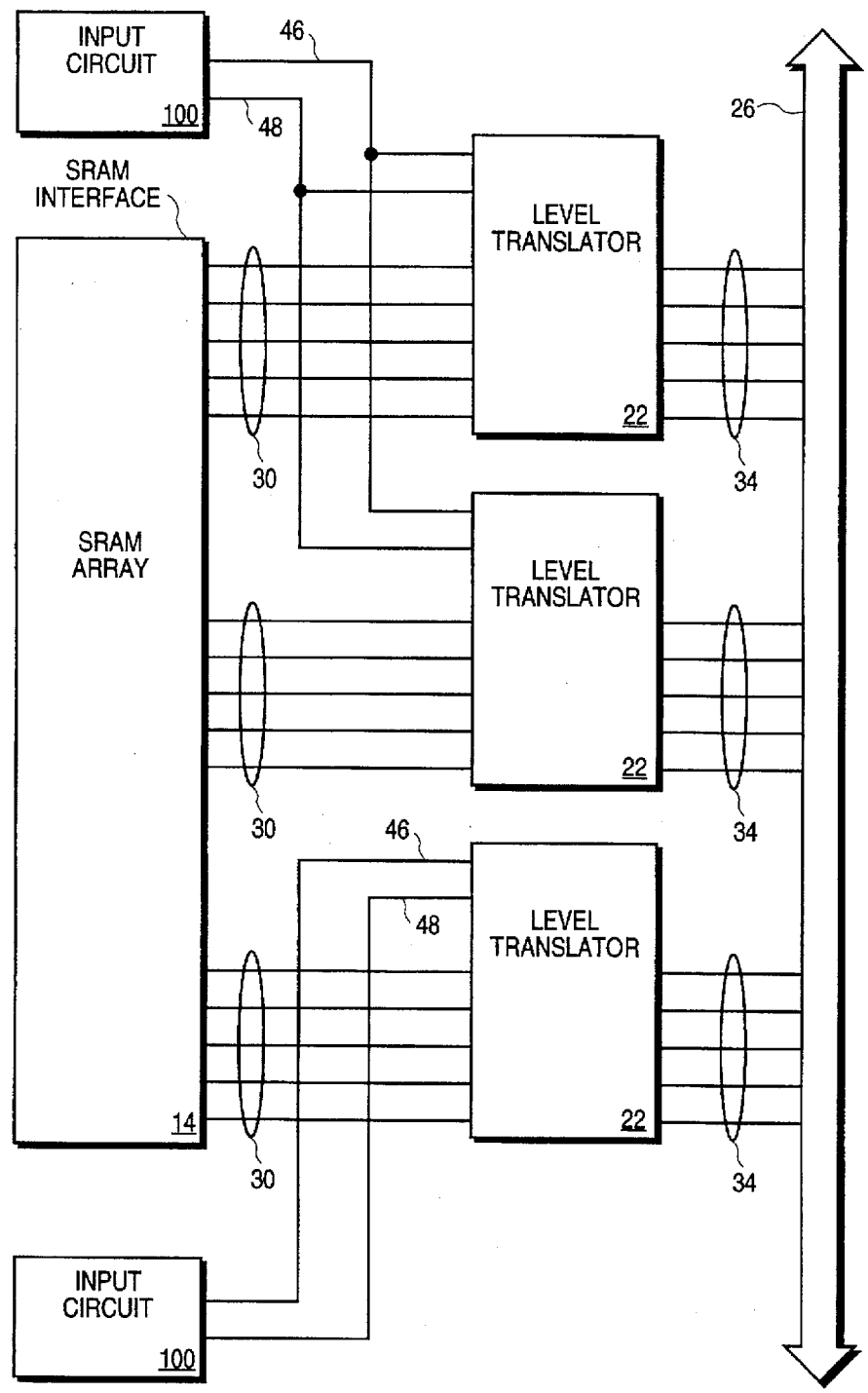
FIGS. 2A and 2B illustrates a level translator.

Referring now to FIG. 2A, an implementation of a level translator 22 is shown. FIG. 2A illustrates a particular embodiment of the present invention converting signals read from a plurality of SRAMs 12 in an SRAM array 14 to signals acceptable by a microprocessor 28. A level translator 22 receives a plurality of translator inputs or outputs 30 from an SRAM array 14 or other digital circuit, using one set of voltages to represent logical states. The level translator 22 also provides a plurality of translator outputs or inputs 34, each translator output or input 34 associated with a distinct translator input or output 30, the translator inputs or outputs 30 and the translator outputs or inputs 34 having distinct sets of voltages representing logical states. The set of voltages representing logical states in the translator inputs or outputs 30 is different from the set of voltages representing logical states in the translator outputs or inputs 34. It will be appreciated that the level translator 22 is bidirectional and thus each connection 30 and 34, such as a line 30, may be either an input or an input. Rather than repeatedly referring to each connection as an input or output, or vice-versa, each connection 30 will be treated, solely for purposes of explanation, as an input and each connection 34 will be treated as an output.

As shown in FIG. 2A, a level translator 22 receives a plurality of translator inputs 30 and a second upper rail voltage 46 and second lower rail voltage 48 which determines the voltages by which the logical values of the translator outputs 34 are represented. It will be appreciated that the chips in the SRAM array are powered by a first upper and lower rail voltages. The level translator 22 provides a plurality of translator outputs 34, each output distinctly associated with a distinct translator input 30, but using voltages one threshold below to the second upper 46 and substantially equivalent to the lower rail 48 voltages to represent logical states. The translator outputs 34, collectively, are provided to a data bus 26 providing information to a processor 28.

An SRAM array 14 comprising a plurality of SRAMs 12 and an SRAM interface 16 provides translator inputs 30 to a plurality of level translators 22. Each translator input 30 represents a distinct SRAM 12 data bit, a logical-one represented as a 5-volt signal and a logical-zero as a zero-volt signal in one embodiment of the invention. Each translator output 34 is associated with a distinct translator input 30, but represents a logical-one as a 3.3 volt signal and a logical-zero as a 0.0 volt signal in one embodiment of the invention.

Figure 2B:
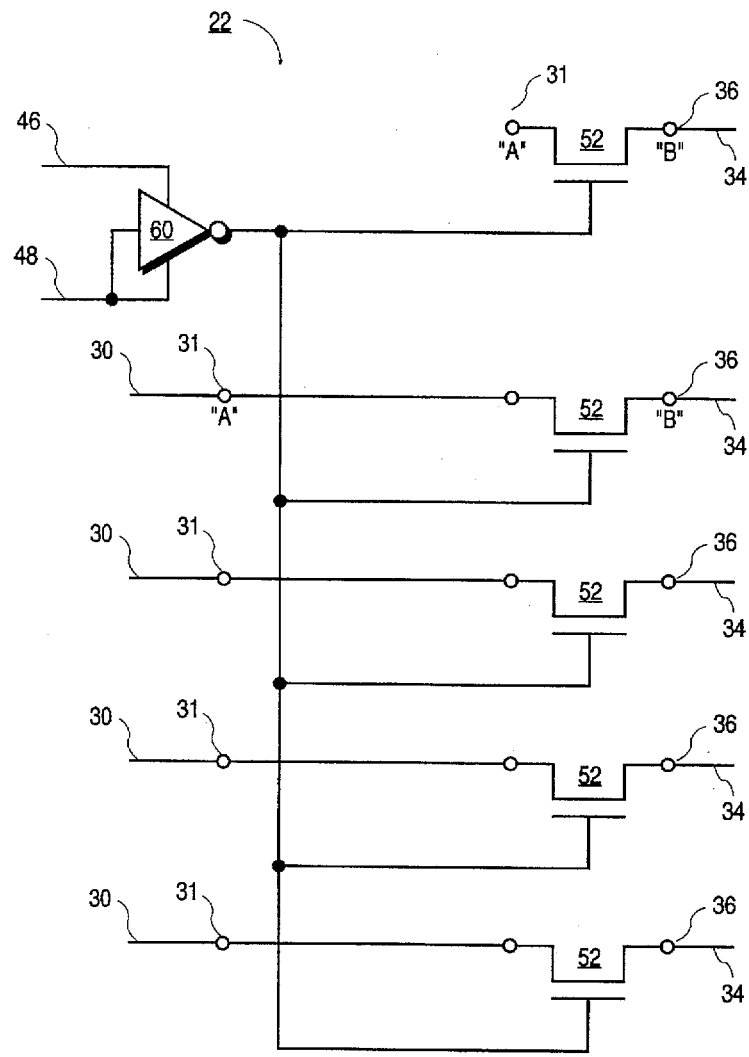

Referring now to FIG. 2B, the internal details of level translators 22 of FIG. 2A are shown in greater detail. Each level translator 22 in the embodiment shown in FIGS. 2A and 2B comprises a plurality of transistors 52 and a logical inverter 60. Each transistor 52 has a source terminal, a drain terminal, and a gate terminal, each transistor 52 having a threshold voltage of about 1.0 volt. The source and drain terminals of each transistor form a current path. One end of the current path of each transistor 52 connects via node 31 with a distinct translator input 30, while the other end of the current path of each transistor 52 connects via a node 36 with a distinct translator output 34.

While the current path terminals of the transistors 52 are connected to the translator inputs 30 and outputs 34, the gate terminals are held at the second upper rail voltage 46; that is, to a voltage one threshold above to the voltage by which a logical-one is represented at the translator outputs 34. To accomplish this, a logical inverter 60 having an input, an output, an upper rail voltage, and a lower rail voltage supplies the gate terminal voltage for a plurality of the transistors 52 on a level translator 22. The logical inverter's 60 input and lower rail are tied to the second lower rail voltage (which in one embodiment is the same as the first lower rail voltage) 48. However, the logical inverter's upper rail voltage is tied to second upper rail voltage 46, received from an input circuit 100. As shown below, it is the input circuit 100 and the generation and regulation of the second upper 46 rail voltage to which the present invention is directed. The inverter 60 may be implemented as a conventional CMOS inverter having two transistors which are insulated gate FETs (p-channel device and an n-channel device) having their source/drain current paths coupled in series between rails 46 and 48 and their gates coupled together as an input.

Because the input of the logical inverter 60 is tied to the lower rail voltage 48 (a voltage representing logical-zero), the output of the logical inverter 60 is driven to the voltage applied to the upper rail voltage 46 of the logical inverter 60, i.e. the second upper 46 rail voltage, in one embodiment 4.3 volts. When the translator input 30 drives the node 31 of transistor 52 to 5.0 volts (in one embodiment), the transistor 52 conducts, and the drain of the transistor 52 approaches the gate voltage, differing only by the threshold voltage of the transistor 52. Because the transistor's 52 gate is tied to the buffered 4.3 volt signal from the inverter in one embodiment and the threshold voltage of the transistor 52 is 1.0 volts in one embodiment, node 34 of the transistor 52 has a 3.3 volt output when the node 31 is high. On the other hand, when the translator input 30 drives the node 31 of transistor 52 to zero volts, node 36 of the transistor 52 falls to zero volts.

It should be noted that, although FIG. 2B illustrates an embodiment wherein each level translator 22 uses a single logical inverter 60 to buffer the 4.3 volts signal, the use of a logical inverter 60 is merely by way of example and not by way of limitation. In other embodiments, other numbers of logical inverters 60 are used, and in still other embodiments other means for buffering the second upper 46 rail voltage replace the logical inverter 60. Furthermore, in embodiments using other input protocols, voltages other than 4.3 volts are used. However, in the embodiment shown in FIG. 2B, the logical inverter 60 generates a buffered 4.3 volt signal.

In the present invention, additional input circuits may be used, to provide a second upper and second lower rail voltage to each level translator individually, or to groups of level translators. Each level translator may comprise a different number of transistors, and a different number of buffers. The voltage level translators need not be transistors, but may comprise any device providing output signals from received input signals. Furthermore, the buffers need not be logical inverters as shown in FIG. 2B, but may comprise any device for ensuring sufficient current and voltage. Finally, a plurality of level translators receiving translator inputs from a plurality of different input circuits, each of which has a different input voltage protocol, may use a plurality of different input circuits to provide a uniform output voltage protocol, by providing each digital circuit translator input with a level translator preset to its voltage levels.

Figure 3:
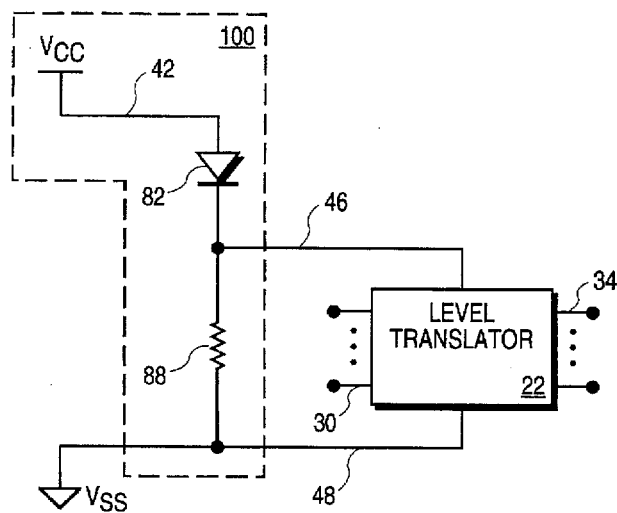
FIG. 3 illustrates a prior art input circuit for generating the second upper rail voltage for a level translator.

Referring now to FIG. 3, a prior art input circuit 100 for generating the second upper rail voltage 46 for a level translator 22 is shown. The input circuit 100 shown in FIG.

3 comprises a forward-biased diode 82, having a positive terminal and a negative terminal, and a resistor 88. The positive terminal of the diode 82 receives the first upper rail voltage 42, which in the embodiment set forth in FIG. 2A is 5.0 volts; this voltage rail is often designated as $V_{cc}$. The negative terminal of the diode 82 provides a constant 4.3 volts, the second upper rail voltage 46, to the level translator 22. The resistor 88 ensures that the diode 82 carries sufficient current to drop a constant 0.7 volts. The diode 82 and the resistor 88 are coupled in series between the first upper rail voltage 42 and the first lower rail voltage $V_{ss}$ which, in this embodiment is also the second lower rail voltage 48.

As stated above in the description of FIG. 2A and 2B, the translator outputs 34 pass through a data bus 26 to a processor 28. The processor 28, such as a Pentium 90 microprocessor 28, may be damaged by voltages in excess of a given value; indeed, the danger of damaging the processor 28 is one reason voltage translators are used. Unfortunately, the use of the circuit as shown in FIG. 3 does not protect the processor 28 adequately. Because the transistors 52 have a constant 1.0 volt threshold voltage between the voltage at the gate terminal and the voltage at the drain terminal, the gate terminal voltage must be prohibited from rising above 4.3 volts or damage to the processor 28 may result. While the input circuit 100 shown in FIG. 3 may provide a constant 4.3 volt signal in many cases, reliance on the 0.7 volt drop across the diode to provide a constant voltage may not be secure, for several reasons. First, resistors 88 and diodes 82 are manufactured in lots having manufacturing tolerances, and thus are known only to within 5%, or in some cases 10%. A given diode may drop 0.6 volts or some other value, due strictly to deviations in manufacture. Second, although in general the voltage dropped across a conducting forward-biased diode 82 is approximately 0.7 volts, diodes do not have purely linear voltage-current characteristics. Thus, if the current through the diode changes, the voltage dropped may vary as well, and may do so non-linearly. Third, because neither the resistor 88 nor the level translator 22 demand a constant current, the current through the diode may indeed vary. Fourth, the resistor 88 and the level translator 22 may be seen as parallel elements connected from the second upper rail 46 to the lower rail voltage 44 and 48 (in most cases, ground). As the current through the level translator 22 changes, the current through the resistor 88 is almost certain to change as well, varying the voltage across the resistor 88. Because the resistor 88 and diode must drop a total of 5.0 volts, then the diode voltage will change as well.

For these and other reasons that will be apparent to one of ordinary skill in the art who has read the identification of the problem stated in the foregoing, an improved method of regulating the voltage applied to the level translator 22 is desirable.

Figure 4:
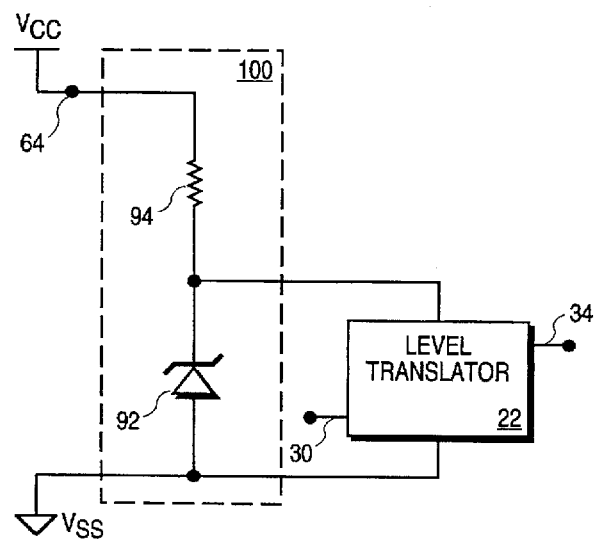
FIG. 4 illustrates a first embodiment of the present invention.

Referring now to FIG. 4, a first embodiment of the present invention is illustrated. In the embodiment shown in FIG. 4, a Zener diode 92 having a fixed voltage rating of 4.3 volts, in parallel with the level translators 22, connects the second upper rail voltage 46 to ground (or to the lower rail voltage). A 100 ohm resistor 94 is placed in series between the external power supply at node 64 and the level translators 22. The temperature variation of the Zener diode 92 is not greater than 0.2 volts. There is no current dependency on the Zener diode 92 on the voltage supplied to the level translator 22; as long as the Zener diode 92 is conducting adequate current, the voltage will be a constant 4.3 volts. The small resistor 94 ensures sufficient current to keep the Zener diode 92 at its rated 4.3 volts.

Figure 5:
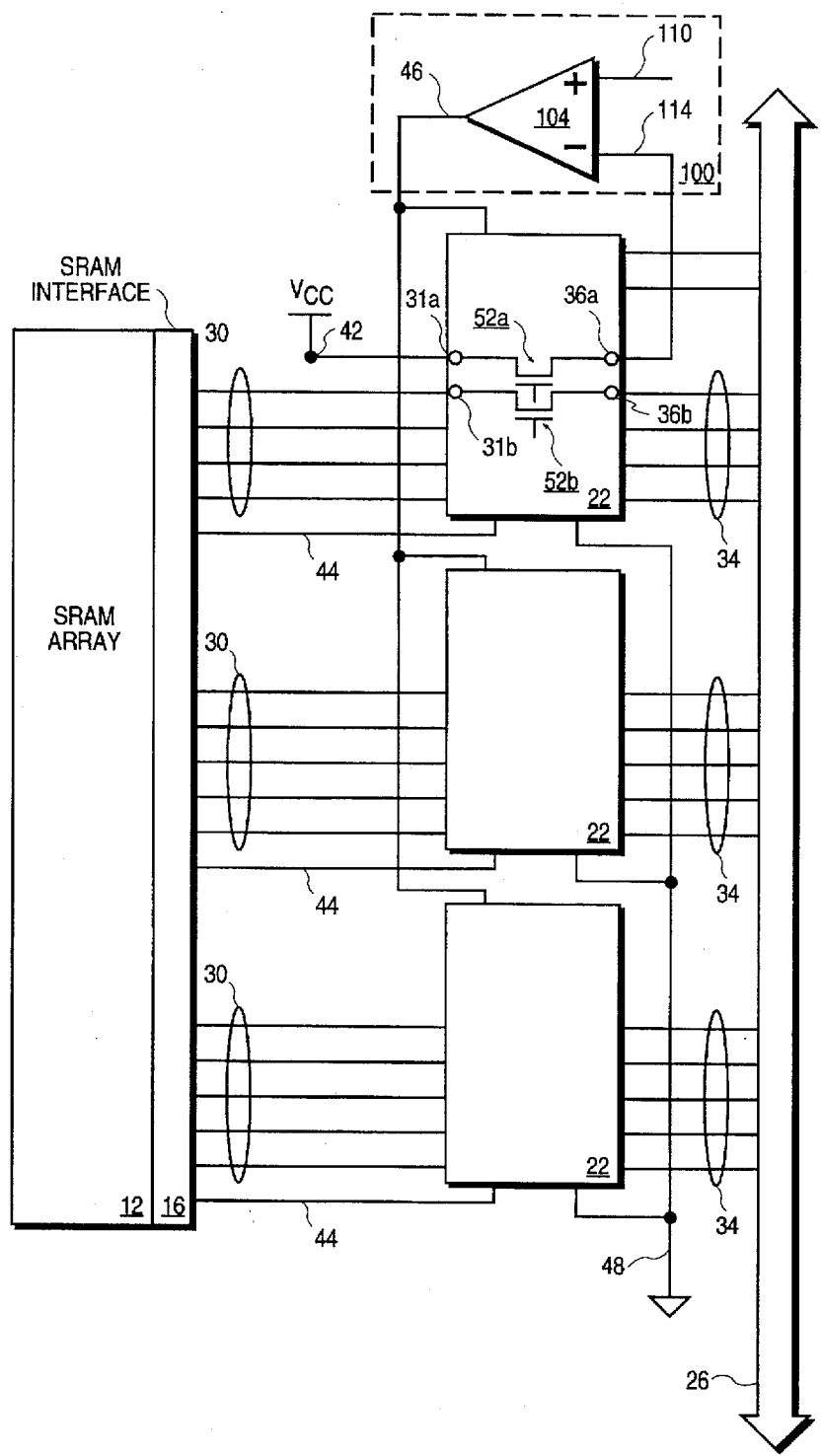
FIG. 5 illustrates a second embodiment of the present invention.

Referring now to FIG. 5, the present invention in another embodiment is shown. The embodiment of the present invention shown in FIG. 5 is intended to be used with a plurality of level translators 22 receiving a plurality of translator inputs 30, a first upper rail voltage 42 and a first lower rail voltage 44 indicating the voltages by which the logical values of the translator inputs 30 are represented, and a second upper rail voltage 46 and second lower rail voltage 48 which determine the voltages by which the logical values of the translator outputs 34 are represented. The present invention is also intended to be used with a digital circuit 12, for example an SRAM array 14 or other digital circuit providing translator inputs 30 and a first upper rail voltage 42 and a first lower rail voltage 44. The illustration presented in FIG. 5 is by way of example and not by way of limitation. As will be readily apparent to one of ordinary skill in the art after referring to the present specification, any circuit providing signals representing information as voltage levels may be substituted for the SRAM array 14 shown in FIG. 5.

A plurality of outputs from the SRAM array 14 are provided to the level translators 22 as translator inputs 30. In the embodiment shown in FIG. 5, the translator inputs 30 are the voltages representing individual bits of a data word returned from the SRAM array 14 in response to a "read" command from a processor 28. Each level translator 22 has a plurality of nodes 31, each node 31 receiving a distinct one of the translator inputs 30, sensitive to the voltages thereof, as shown in FIG. 2B. Each of the nodes 31 is coupled, through its respective transistor 52, to the corresponding node 36; this is shown in FIG. 5.

In the embodiment of the present invention shown in FIG. 5, the second upper rail voltage 46 is provided by an operational amplifier 104 providing feedback control of the level translator's 22 second upper rail voltage 46. When an operational amplifier 104 of very high open loop gain is used, the output level of the operational amplifier 104, equal to the second upper rail voltage 46, is not able to exceed the reference signal 110. The positive input terminal of the operational amplifier 104 is supplied with a reference signal 110 equal to the desired limit. The output 46 of the operational amplifier 104 is applied to the level translator's 22 second upper rail voltage 46, and the negative input terminal 108 of the operational amplifier 104 is supplied by a node 36 of the level translator 22. In effect, this node provides a VOH signal on line 114 to the amplifier 104. As shown in FIG. 5, one of the input lines of the level translator 22 is selected to receive the first upper rail voltage and the corresponding output line is coupled to the negative input of the operational amplifier 104. The remaining input and output lines of the level translator 22 are used in the conventional manner. In this way, degenerative feedback provided by the operational amplifier 104 limits all voltages output from a level translator 22 to the voltage level of the reference signal 110. If the level translator 22 applied a voltage to the data bus 26 that exceeded this limit, the VOH signal 114 at the "B" node 36 of the level translator 22 would rise to the maximum voltage the level translator 22 was supplying to the bus 26. The higher VOH 114 voltage would reduce the voltage output 46 from the operational amplifier 104, thus reducing the voltage applied to the level translator's 22 second upper rail voltage 46. Therefore, due to the feedback through the operational amplifier 104, the voltage at the "B" node 36 and bus 26 of the level translator 22 is held to a maximum of the reference signal 110. A plurality of level translators 22, located at the output of a digital circuit 12, provide signals to a data bus 26.

Figure 6:
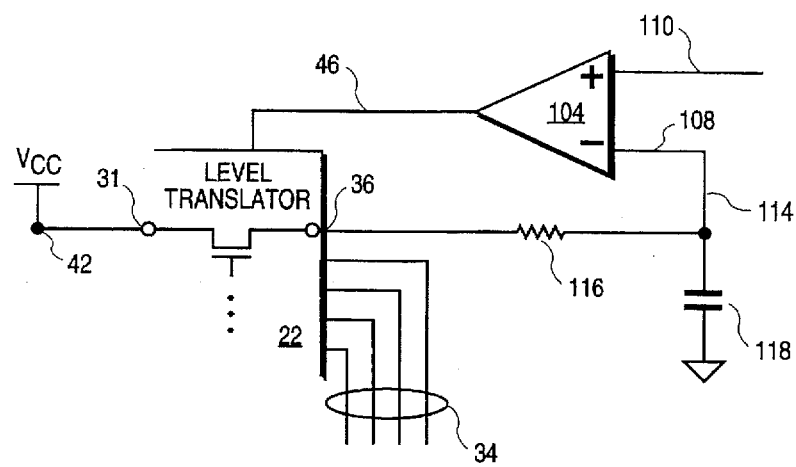
FIG. 6 illustrates another embodiment of the present invention including an RC circuit to remove oscillations.

Referring now to FIG. 6, another embodiment of the present invention, including an RC circuit to remove oscillations, is shown. In the embodiment shown in FIG. 6, a translator output on node 36 does not pass directly as a VOH signal 114 directly into the operational amplifier; rather, a resistor 116 between the "B" node 36 of the level translator 22 and the negative input terminal 108 of the operational amplifier 104 may drop voltage, thus allowing the VOH signal 114 provided to the operational amplifier 104 to differ somewhat from the translator output on node 36. In particular, low frequency or D.C. components of the translator output 34 pass through the resistor 116 to the negative input terminal 108 of the operational amplifier 104, while the higher-frequency components of the VOH signal 114 pass through a capacitor 118 to ground (or the lower rail voltage). The capacitance of the RC circuit removes noise and other high-frequency signals from the VOH signal 114, while the operational amplifier 104 forces the VOH signal 114 to the reference voltage 110.

Figure 7:
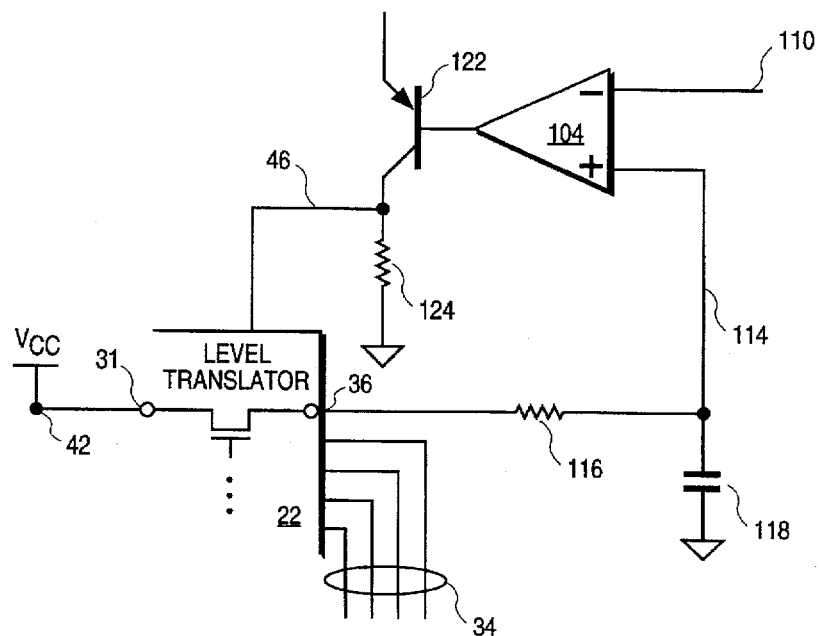
FIG. 7 illustrates another embodiment of the present invention in which a transistor buffers the current provided to the local second upper rail voltage.

Referring now to FIG. 7, another embodiment of the present invention in which a transistor 122 buffers the current provided to the local second upper rail voltage 46 is shown. In this embodiment, however, the operational amplifier 104 is reversed in polarity from the implementation in FIGS. 5 and 6. A VOH signal 114 is applied to the positive input terminal of the operational amplifier 104, while the reference signal 110 is applied to the negative terminal. The output of the operational amplifier 104, rather than connecting directly to the level translator's 22 second upper rail voltage 46, is applied through a transistor 122 that buffers the current applied to the level translator's 22 second upper rail voltage 46. A resistor 124 connects the collector 126 of the transistor 122 (and the second upper rail voltage 46) to ground (i.e., the second lower rail voltage 48), providing a lower rail voltage 48 when the transistor 122 conducts. If VOH signal 114 exceeds the reference signal 110 at the negative input of the operational amplifier 104, the transistor 122 tends to turn off, reducing the second upper rail voltage 46 available to the level translators 22. On the other hand, if the voltage of the VOH signal 114 falls below the reference signal 110 on the positive operational amplifier input, the operational amplifier output falls and the transistor 122 saturates, driving current through the pull-down resistor 124 and raising the second upper rail voltage 46. Thus, feedback keeps the second upper rail voltage 46 very close to the reference signal 110 voltage, while making a large current source available.

We claim:

1. A method of limiting the voltages of input signals, and of generating output signals with voltages less than or equal to a desired voltage limit, comprising the steps of:

generating a reference signal and a lower rail signal, the reference signal being at a voltage equal to the sum of the lower rail voltage and the desired voltage limit;

applying an input signal to an input of a digital device having a second upper rail voltage and a second lower rail voltage terminal;

generating a difference signal by subtracting the output of the digital device from the reference signal;

applying the difference signal to the second upper rail voltage terminal of the digital device and applying the lower rail signal to the second lower rail voltage terminal of the digital device.

2. The method as set forth in claim 1, wherein the lower rail voltage is ground potential.

3. A method of limiting the voltages of input signals, and of generating output signals with voltages less than or equal to a desired voltage limit, comprising the steps of:

generating a reference signal and a lower rail signal, the reference signal being at a voltage equal to the sum of the lower rail voltage and the desired voltage limit;

applying an input signal to an input of a digital device having a second upper rail voltage and a second lower rail voltage terminal;

generating a difference signal by subtracting the output of the digital device from the reference signal;

applying a second upper rail voltage signal to the second upper rail voltage terminal of the digital device and applying the lower rail signal to the second lower rail voltage terminal of the digital device, said second upper rail voltage signal having a voltage equal to the difference signal.

4. A voltage level translator circuit, for limiting an input signal to a desired voltage limit, comprising:

a digital device receiving an input signal and providing a plurality of output signals, said digital device having an upper rail voltage terminal and a lower rail voltage terminal;

a reference signal generator, generating a reference signal equal to a desired voltage limit;

a differential amplifier having a first and second input, receiving the reference signal and receiving an output of the digital device, and generating a difference signal;

means for applying the difference signal to the upper rail voltage terminal of the digital device.

5. The voltage level translator circuit as set forth in claim 4, wherein the differential amplifier is an operational amplifier.

6. The voltage level translator circuit as set forth in claim 4, wherein said means for applying the difference signal to the upper rail voltage terminal of the digital device further comprises a current buffer.

7. The voltage level translator circuit as set forth in claim 6, wherein said current buffer comprises a transistor.

8. A voltage level translator circuit, for limiting an input signal to a desired voltage limit, comprising:

a digital device receiving an input signal and providing a plurality of output signals, said digital device having an upper rail voltage terminal and a lower rail voltage terminal;

a reference signal generator, generating a reference signal equal to a desired voltage limit;

a differential amplifier, having a first and second input, said differential amplifier generating a difference signal;

means for connecting the reference signal to the first input of the differential amplifier;

means for connecting an output of the digital device to the second input of the differential amplifier; and means for applying the difference signal to the upper rail voltage terminal of the digital device.

9. A voltage level translator circuit as set forth in claim 8, wherein said means for connecting an output of the digital device to the second input of the differential amplifier comprises a means for attenuating noise.

10. A voltage level translator circuit as set forth in claim 9, wherein said means for attenuating noise comprises a resistor and a capacitor in an RC network.

11. A voltage level translator circuit as set forth in claim 8, wherein:

said means for connecting an output of the digital device to the second input of the differential amplifier comprises a means for attenuating noise;

means for applying the difference signal to the upper rail voltage terminal of the digital device comprises a current buffer.

12. The voltage level translator circuit as set forth in claim 8, wherein:

the differential amplifier is an operational amplifier;

said means for applying the difference signal to the upper rail voltage terminal of the digital device comprises a current buffer comprising a transistor;

said means for connecting an output of the digital device to the second input of the differential amplifier comprises a means for attenuating noise comprising a resistor and a capacitor in an RC network.

13. A level translator circuit comprising at least one level translator supplying a plurality of output voltages and receiving a plurality of input voltages, wherein the level translator receives a control voltage regulated by a Zener diode.

14. A level translator circuit as set forth in claim 13, further comprising a resistor connected so as to ensure sufficient current through the Zener diode to maintain substantially constant voltage across the Zener diode.

15. A level translator circuit, comprising:

a plurality of level translators providing local second upper rail voltage levels to local circuits, a plurality of said level translators powered by an external power supply connected to the local second upper rail voltage input of said local translators via a Zener diode.

16. A level translator circuit as set forth in claim 15, further comprising a resistor connected so as to ensure sufficient current through the Zener diode to maintain substantially constant voltage across the Zener diode.

* * * * *